United States Patent

Schaeffer et al.

[11] Patent Number: 5,843,586
[45] Date of Patent: Dec. 1, 1998

[54] SINGLE-CRYSTAL ARTICLE HAVING CRYSTALLOGRAPHIC ORIENTATION OPTIMIZED FOR A THERMAL BARRIER COATING

[75] Inventors: Jon C. Schaeffer, Milford; Mark A. Rosenzweig, Hamilton; Kevin G. McAllister, West Chester; P. Kennard Wright, Cincinnati, all of Ohio

[73] Assignee: General Electric Company, Cinncinnati, Ohio

[21] Appl. No.: 785,178

[22] Filed: Jan. 17, 1997

[51] Int. Cl.⁶ ............................ B22B 15/04; F01D 5/28
[52] U.S. Cl. .................... 428/633; 428/680; 148/404; 427/405; 416/241 R; 416/241 B
[58] Field of Search .................... 428/632, 633, 428/680, 678, 621, 615; 148/404; 164/122.2; 427/405; 416/241 R, 241 B

[56] References Cited

U.S. PATENT DOCUMENTS

| | | | |
|---|---|---|---|
| 4,580,613 | 4/1986 | Miller et al. | 164/35 |
| 4,605,452 | 8/1986 | Gemma et al. | 148/404 |
| 5,062,469 | 11/1991 | Monte et al. | 164/122.2 |
| 5,682,747 | 11/1997 | Brown et al. | 60/746 |

*Primary Examiner*—John J. Zimmerman
*Attorney, Agent, or Firm*—Andrew C. Hess; David L. Narciso

[57] ABSTRACT

A single-crystal article having a thermal barrier coating on a surface thereof, and a method for processing the article so as to promote the life of the coating. As a result of its single-crystal microstructure, the article is characterized by having been unidirectionally solidified along a primary crystallographic direction, and secondary crystallographic directions that are normal to the primary crystallographic direction. Improved spallation resistance of the coating is achieved by selectively orienting the secondary crystallographic direction with respect to a direction normal to a life-limiting surface region of the thermal barrier coating.

20 Claims, 2 Drawing Sheets

SINGLE-CRYSTAL ARTICLE HAVING CRYSTALLOGRAPHIC ORIENTATION OPTIMIZED FOR A THERMAL BARRIER COATING

This invention relates to coatings for single-crystal components exposed to high temperatures, such as the hostile thermal environment of a gas turbine engine. More particularly, this invention is directed to a method for enhancing the spallation resistance of a thermal barrier coating system through selective orientation of the primary and secondary crystallographic directions of the single-crystal component on which the coating system is formed.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through the formulation of nickel and cobalt-base superalloys, though such alloys alone often do not retain adequate mechanical properties for components located in certain sections of a gas turbine engine, such as the turbine, combustor and augmentor. A common solution is to thermally insulate these components in order to minimize their service temperatures. For this purpose, thermal barrier coatings (TBC) formed on the exposed surfaces of high temperature components have found wide use.

To be effective, thermal barrier coatings must have low thermal conductivity, strongly adhere to the article, and remain adherent throughout many heating and cooling cycles, i.e., exhibit thermal fatigue resistance. The latter requirement is particularly demanding due to the different coefficients of thermal expansion between ceramic materials with low thermal conductivity and superalloy materials typically used to form turbine engine components. Thermal barrier coating systems capable of satisfying the above requirements have generally required a metallic bond coat deposited on the component surface, followed by an adherent ceramic layer that serves to thermally insulate the component. In order to promote the adhesion of the ceramic layer to the component and inhibit oxidation of the underlying superalloy, the bond coat is typically formed from an oxidation-resistant aluminum-containing alloy such as MCrAlY (where M is iron, cobalt and/or nickel), or by an oxidation-resistant aluminum-based intermetallic such as nickel aluminide or platinum aluminide.

Various ceramic materials have been employed as the ceramic layer, particularly zirconia ($ZrO_2$) stabilized by yttria ($Y_2O_3$), magnesia (MgO), ceria ($CeO_2$), scandia ($Sc_2O_3$), or another oxide. These materials are widely employed in the art because they exhibit desirable thermal cycle fatigue properties, and also because they can be readily deposited by plasma spray, flame spray and vapor deposition techniques. In order to increase the resistance of the ceramic layer to spallation when subjected to thermal cycling, the prior art has proposed ceramic layers having enhanced strain tolerance as a result of the presence of porosity, microcracks and segmentation of the ceramic layer. Thermal barrier coating systems employed in higher temperature regions of a gas turbine engine are typically deposited by electron beam physical vapor deposition (EBPVD) techniques that yield a columnar grain structure that is able to expand and contract without causing damaging stresses that lead to spallation.

Though significant improvements in spallation resistance have been achieved for thermal barrier coatings, spallation is likely to occur over time at elevated temperatures. Once spallation of the ceramic layer has occurred, the component tends to rapidly deteriorate. If detected early, the component is refurbished or scrapped at considerable cost. Therefore, further improvements are continuously sought to increase the service life of a thermal barrier coating system by improving its resistance to spallation.

SUMMARY OF THE INVENTION

It is an object of this invention to promote the service life of a coating on an article designed for use in a hostile thermal environment, such as superalloy components of a gas turbine engine.

It is another object of this invention to increase the service life of a thermal barrier coating system through appropriate processing the article on which the coating is formed.

It is yet another object of this invention that the article is a single-crystal casting characterized by primary and secondary crystallographic directions, wherein the article is cast such that the secondary crystallographic direction is oriented relative to life-limiting regions of the thermal barrier coating system in order to promote the durability of the coating system.

It is still another object of this invention that the secondary crystallographic orientation of the article is particularly controlled to reduce strain levels in the life-limiting regions of the article, yet is also controlled to maintain acceptable mechanical properties of the article.

The present invention provides a single-crystal article having a coating on a surface thereof, and a method for processing the article so as to promote the life of the coating. The invention is particularly directed to thermal barrier coating systems that have at least one region prone to spallation prior to other regions of the coating system as a result of a combination of in-service temperature and strain levels. Such a region will be termed a "life-limiting surface region" herein, with the understanding that more than one life-limiting region could be present, and the size and shape of the region will be dependent on the physical and dimensional characteristics of the article on which the coating system is formed.

As a result of its single-crystal microstructure, the article is characterized by having been unidirectionally solidified along a primary crystallographic direction, conventionally defined by a <001> type direction in a cubic crystal. In addition, the article will have secondary crystallographic directions that are normal to the primary crystallographic direction. According to this invention, significant and unexpected enhancements in spallation resistance of a thermal barrier coating system can be achieved by selectively orienting the secondary crystallographic directions to be offset from a direction substantially normal to the life-limiting surface region of the coating system.

With the teachings of this invention, the overall durability of a single-crystal article and its thermal barrier coating system can be positively influenced by controlling the primary and secondary crystallographic orientations of the casting to provide a balance between optimization of the spallation resistance of the coating system and the mechanical properties required of the article. For example, the primary crystallographic direction of a single-crystal turbine blade can be oriented along the radial length of the blade to promote its mechanical properties, while certain secondary crystallographic directions are intentionally oriented in directions that are not normal to the surface of the life-limiting region of the coating system. A suitable orientation for a secondary crystallographic direction defined by a <001> type direction is about 20 to about 45 degrees, and preferably about 45 degrees from the direction normal to the life-limiting surface region of the coating system.

A significant advantage of this invention is that the service life of a thermal barrier coating system can be significantly improved and rendered more predictable by appropriately controlling the secondary crystallographic directions of a single-crystal casting, such as a turbine component of a gas turbine engine. As a result, servicing of the engine can be reduced, and the life cycle costs decreased. Notably, the invention can be implemented with minimal additional cost, which will be insignificant compared to the cost savings realized by extending the service life of a component. Finally, the benefits of this invention can be attained quickly by appropriately modifying the casting process for a component based on an examination of the spallation pattern on parts that has been removed from service.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1:
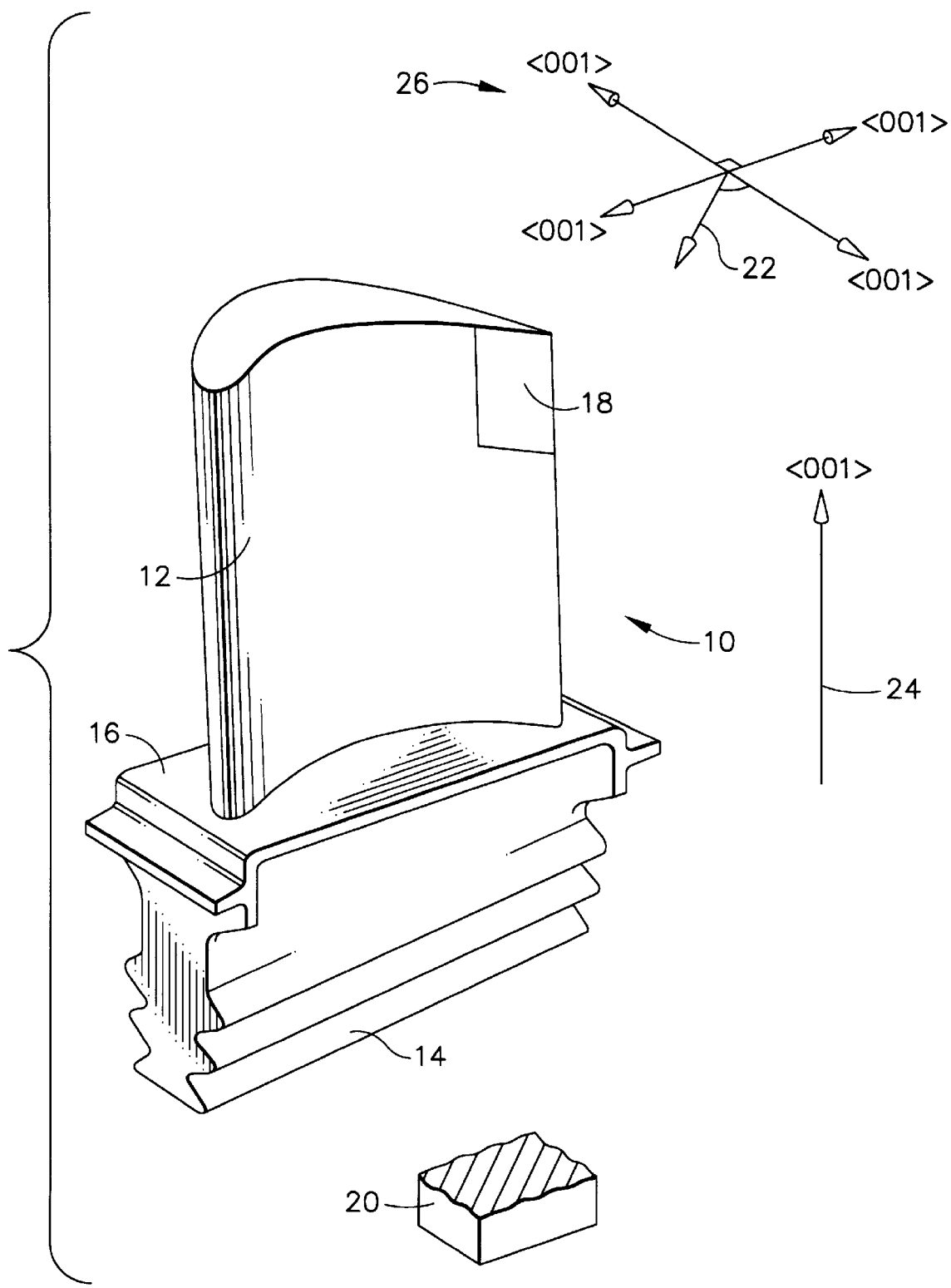
FIG. 1 is a perspective view of a single-crystal turbine blade of a gas turbine engine, with preferred primary and secondary crystallographic directions being indicated in accordance with this invention.

The present invention is generally applicable to components that operate within environments characterized by relatively high temperatures, and are therefore subjected to severe thermal stresses and thermal cycling. Notable examples of such components include the high and low pressure turbine nozzles, vanes and blades, shrouds, combustor liners and augmentor hardware of gas turbine engines. An example of a high pressure turbine blade 10 is shown in FIG. 1. The blade 10 generally includes an airfoil 12 and platform 16 against which hot combustion gases are directed during operation of the gas turbine engine, and whose surfaces are therefore subjected to severe attack by oxidation, corrosion and erosion. The airfoil 12 and platform 16 are anchored to a turbine disk (not shown) with a dovetail 14 formed on a shank section of the blade 10. While the advantages of this invention will be described with reference to the high pressure turbine blade 10 shown in FIG. 1, the teachings of this invention are generally applicable to any component on which a coating may be used to protect the component from its environment.

According to conventional practice in the art, the surfaces of the airfoil 12 and platform 16 are protected from their hostile service environment with a thermal barrier coating system. Such coating systems typically include a bond coat on the blade substrate, over which a ceramic layer is deposited so as to be adhered to the airfoil 12 and platform 16 with the bond coat. As is known in the art, the bond coat can be a nickel or platinum aluminide formed by a diffusion process, or an MCrAlY alloy of a type known in the art, which develops a protective aluminum oxide scale. A preferred material for the ceramic layer is an yttria-stabilized zirconia (YSZ), a preferred composition being about 6 to about 8 weight percent yttria, though other ceramic materials could be used, such as yttria, nonstabilized zirconia, or zirconia stabilized by magnesia, ceria, scandia or another oxide. The ceramic layer may be deposited by various known techniques, such as by physical vapor deposition and plasma spraying, to achieve a thickness that is sufficient to provide the required thermal protection for the underlying blade substrate.

Suitable materials for the blade 10 include single-crystal, investment cast nickel and cobalt-base superalloys. A notable example is a nickel-base superalloy known as Renè N5, disclosed in copending U.S. patent application Ser. No. 08/270,528, and assigned to the assignee of this invention. This superalloy nominally contains, in weight percent, about 1.5% molybdenum, about 5% tungsten, about 3% rhenium, and about 6.5% tantalum, in addition to various other important alloying constituents.

In accordance with this invention, though the bond coat and ceramic layer of the thermal barrier coating system can be individually optimized to promote the spallation resistance of the coating system, the service life of the blade 10 will often be limited by spallation of the coating system due to its exposure to severe temperatures and thermal cycling. In particular, a large thermal gradient is present across the coating system, which, in combination with the differing coefficients of thermal expansion between the ceramic layer and superalloy substrate, results in the presence of significant strains.

As is apparent from FIG. 1, blades of a gas turbine engine have a complex geometry, and the susceptibility to spallation of a thermal barrier coating system is therefore complicated by the differing thermal and mechanical stresses induced during the operation of the engine. The present invention recognizes that the mechanical properties of single-crystal material are anisotropic, in that the properties vary with crystallographic direction. For face-centered cubic (f.c.c.) single-crystals such as Renè N5, the elastic modulus (E) is greatest in the <111> crystallographic directions and least in the <001> directions. FIG. 1 shows the primary <001> type direction as identified by the reference number 24 relative to the blade 10, while four secondary <001> type directions 26 ([100], [010], [100] and [010]) are identified in a second coordinate system for purposes of clarity. Because strain ($\epsilon$) and elastic modulus are inversely related ($\epsilon=\sigma/E$, where $\sigma$ is stress), the low modulus <001> directions will correspond to a region of the blade 10 whose thermal barrier coating system will often be subject to maximum strain. Taking into account the influence of temperature and stress differences, life-limiting regions of a coating system on the blade 10 can be identified as being more likely to spall than on other regions on the blade 10. An example of such a life-limiting region is identified in FIG. 1 as being at the pressure side trailing edge tip 18. Those skilled in the art will appreciate that different life-limiting regions are possible.

Figure 2:
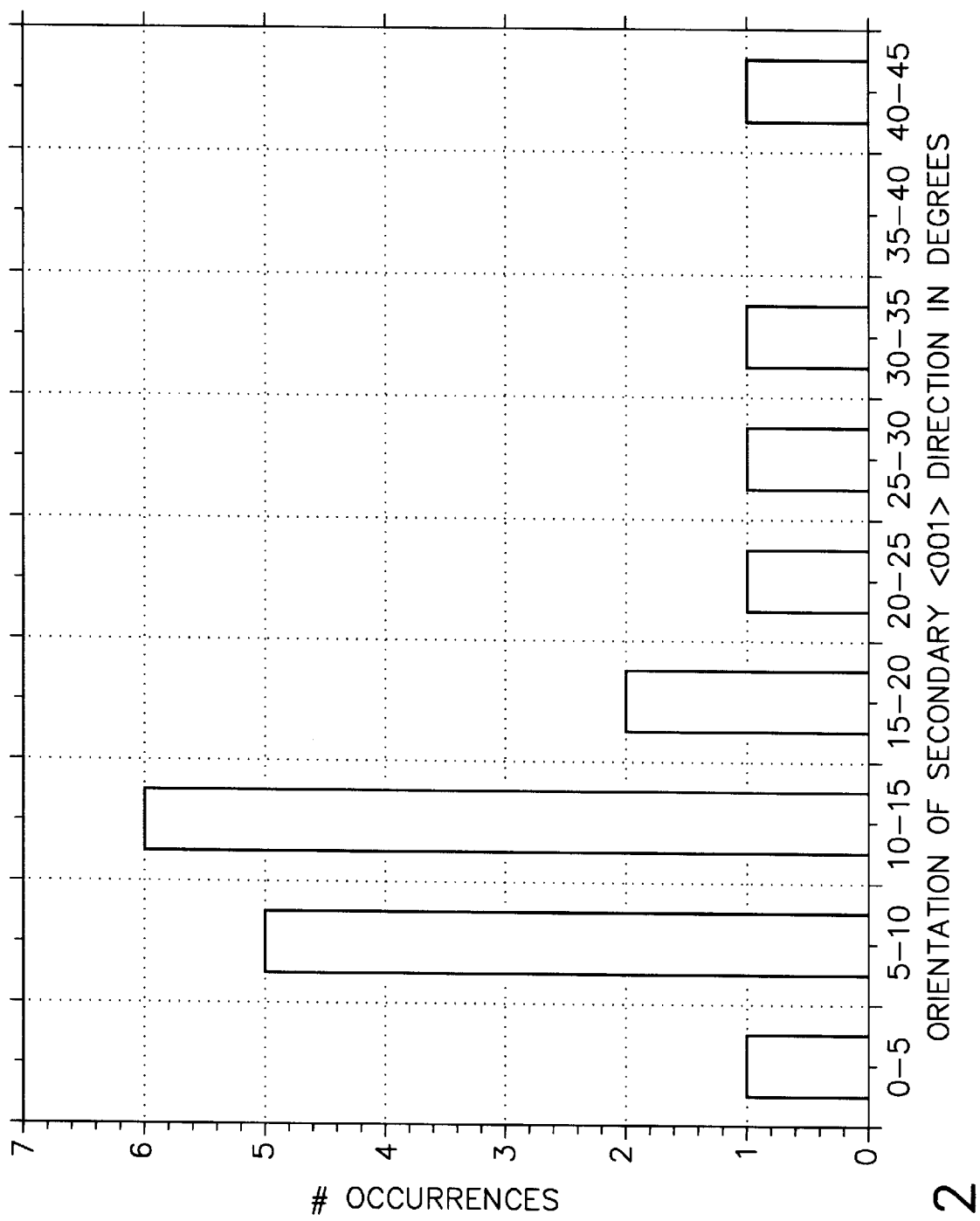
FIG. 2 is a graph evidencing the correlation of spallation with the orientation of the secondary crystallographic direction in a single-crystal specimen.

The present invention was developed from the realization that, with the primary <001> crystallographic direction being the direction of crystal growth (i.e., the direction in which the solidification front progresses unidirectionally) in an f.c.c. material (as indicated in FIG. 1), a high degree of correlation could be observed between spallation and a secondary <001> type crystallographic direction of a single-crystal f.c.c. material, such as a single-crystal nickel-base specimen. In particular, FIG. 2 graphically evidences that the occurrence of spallation on a single-crystal Renè N5 investment casting was most prominent within the range of about five to about twenty degrees from a secondary <001> type crystallographic direction of the casting, and least likely within the range of about twenty to about forty-five degrees from the secondary <001> direction. Based on evaluations of these results, the present invention establishes that significant and unexpected enhancements in spallation resistance of a thermal barrier coating system can be achieved by selectively orienting the secondary <001> type crystallographic direction to be about twenty to about forty-five degrees, preferably thirty-five to forty-five degrees and ideally about forty-five degrees, from a direction substantially normal to a life-limiting surface region of a coating, such as a thermal barrier coating system.

Accordingly, this invention proposes that the overall durability of a single-crystal cast article and its coating can be influenced by controlling the primary and secondary crystallographic orientations of the casting to provide a balance between optimization of the spallation resistance of the ceramic coating and the mechanical properties required of the article. For example, the primary <001> type crystallographic direction of the single-crystal turbine blade 10 would be oriented to be parallel to the radial length of the blade 10 to promote its mechanical properties, while the secondary <001> crystallographic directions are intentionally oriented in directions that are not normal to the surface of the life-limiting region of the thermal barrier coating system on the blade 10. As shown in FIG. 1, the secondary <001> type crystallographic directions 26 are shown as being oriented approximately forty-five degrees from a direction 22 that is normal to the surface of the edge tip 18 of the blade 10. Therefore, the direction 22 coincides with a secondary <110> type crystallographic direction of the single-crystal nickel-base blade 10.

According to this invention, the above preferred crystallographic orientations can be achieved by appropriately "seeding" and controlling the progress of the solidification front during the casting process. While the techniques necessary to achieve the desired results are known in the art, the specific methodology of identifying the life-limiting regions and intentionally orienting the secondary crystallographic directions relative to those regions is novel to this invention. According to this invention, the blade 10 would be investment cast with a thermal gradient established such that the solidification front progresses unidirectionally and along the primary crystallographic direction, which is a <001> type direction in a nickel-base superalloy. In addition, a single crystallographic orientation for the blade 10 is established, such as by having the solidification front pass through a narrow restriction, known in the art as a selector, through which only a single grain can propagate.

While the above steps are important to this invention, they do not control the secondary <001> directions of the casting. Therefore, a selective seeding technique is employed by which a melt of the desired alloy is poured into an investment pattern having a chill containing a small block of single-crystal "seed" material, as represented in FIG. 1 by the reference number 20. The casting grows epitaxially from the crystalline structure and orientation of the seed material 20. Through knowledge of its crystallographic structure, the seed material 20 can be selectively oriented within the investment mold so as to be aligned with the primary and secondary crystallographic directions desired for the casting, based on the location and orientation of known or predicted life-limiting regions of the casting, such that the primary and secondary crystallographic directions are fixed within the casting.

The step of identifying one or more life-limiting regions of a single-crystal article can be performed in various ways. For example, a single-crystal specimen can be cast to solidify unidirectionally along a primary crystallographic direction with a known secondary crystallographic direction. After depositing a thermal barrier coating system on the specimen, the coated casting can be subjected to physical testing to identify life-limiting surface regions. Alternatively, an analytical model of the single-crystal casting could be generated and analyzed to identify the life-limiting surface regions. Another method is to examine the spallation pattern on components that have been removed from service, and then appropriately modify the method used to cast subsequently manufactured components.

While the invention has been described in terms of a preferred embodiment, other forms could be adopted by one skilled in the art, such as by the use of different alloys and different casting techniques, and applying the teachings to other single-crystal articles that are coated with a coating susceptible to spallation. Accordingly, the scope of the invention is to be limited only by the following claims.

What is claimed is:

1. In a single-crystal article having a coating on a surface thereof, the single-crystal article being characterized by having been unidirectionally solidified along a primary crystallographic direction that is substantially parallel to the surface, the coating having a life-limiting surface region characterized by a combination of temperature and strain levels that promote spallation of the coating in the life-limiting surface region prior to other regions of the coating, wherein the improvement comprises;

the single-crystal article having a secondary crystallographic direction normal to the primary crystallographic direction and oriented about 20 to about 45 degrees from a direction normal to the life-limiting surface region of the coating.

2. A single-crystal article as recited in claim 1, wherein the single-crystal article is formed of a nickel-base superalloy.

3. A single-crystal article as recited in claim 2, wherein the primary crystallographic direction is a <001> crystallographic direction of the single-crystal article.

4. A single-crystal article as recited in claim 3, wherein the direction normal to the life-limiting surface region approximately coincides with a <110> type crystallographic direction of the single-crystal article.

5. A single-crystal article as recited in claim 1, wherein the single-crystal article is a component of a gas turbine engine.

6. A single-crystal article as recited in claim 1, wherein the coating comprises a metallic bond coat on the single-crystal article, and a ceramic layer adhered to the single-crystal article by the bond coat.

7. A single-crystal article as recited in claim 1, wherein the secondary crystallographic direction is oriented about 35 to about 45 degrees from the direction normal to the life-limiting surface region of the coating.

8. In a single-crystal nickel-base superalloy turbine blade having a thermal barrier coating system on a surface thereof, the turbine blade being characterized by having been unidirectionally solidified along a primary crystallographic direction substantially parallel to the surface and corresponding to a <001> crystallographic direction of the turbine blade, the thermal barrier coating system having a life-limiting surface region characterized by a combination of in-service temperature and strain levels that promote spallation of the thermal coating system having a life-limiting surface region prior to other regions of the thermal barrier coating system, wherein the improvement comprises:

the turbine blade having a secondary <001> crystallographic direction normal to the primary crystallographic direction and oriented about 20 to about 45 degree from a direction normal to the life-limiting surface region of the thermal barrier coating.

9. A turbine blade as recited in claim 8, wherein the direction normal to the life-limiting surface region approximately coincides with a <110> crystallographic direction of the single-crystal article.

10. A turbine blade as recited in claim 8, wherein the secondary <001> crystallographic direction oriented about 35 to about 45 degrees from the direction normal to the life-limiting surface region of the thermal barrier coating system.

11. A method for promoting the service life of coating on a single-crystal article, the method comprising the steps of:

identifying a surface of the single-crystal article corresponding to a life-limiting surface region of the coating, the life-limiting surface region being characterized by a combination by a combination of temperature and strain levels that promote spallation of the coating in the life-limiting surface region prior to other regions of the coating;

casting the single-crystal article to solidify unidirectionally along a primary crystallographic direction that is substantially parallel to the surface and such that a secondary crystallographic direction normal to the primary crystallographic direction is oriented about 20 to about 45 degrees from a direction normal to the life-limiting surface region of the coating, and then forming the coating on the single-crystal article.

12. A method as recited in claim 11, wherein the single-crystal article is formed of a nickel-base superalloy.

13. A method as recited in claim 11, wherein the primary crystallographic direction is a <001> crystallographic direction of the single-crystal article.

14. A method as recited in claim 13, wherein the secondary crystallographic direction is oriented about 35 to about 40 degrees from the direction normal to the life-limiting surface region of the coating.

15. A method as recited in claim 13, wherein the direction normal to the life-limiting surface region approximately coincides with a <110> crystallographic direction of the single-crystal article.

16. A method as recited in claim 11, wherein the single-crystal article is cast to be a component of a gas turbine engine.

17. A method as recited in claim 11, further comprising the step of forming the coating, the coating comprising a metallic bond coat on the single-crystal article, and a ceramic layer adhered to the single-crystal article by the bond coat.

18. A method as recited in claim 11, wherein the step of identifying the life-limiting surface region of the coating entails casting a specimen of the single-crystal article to solidify unidirectionally along a primary crystallographic direction with a known secondary crystallographic direction, forming the coating on the specimen, and then subjecting the specimen to physical testing to identify the life-limiting surface region of the coating.

19. A method as recited in claim 11, wherein the step of identifying the life-limiting surface region of the coating entails generating an analytical model of the single-crystal article, and then analyzing the analytical model to identify the life-limiting surface region of the coating.

20. A method as recited in claim 11, wherein the casting step entails seeding a mold with a solid single-crystal material having primary and secondary crystallographic directions that are aligned with the primary and secondary crystallographic directions desired for the single-crystal article, pouring molten material into the mold, and unidirectional solidifying along the primary crystallographic direction.

* * * * *